United States Patent [19]
Hajime et al.

[11] Patent Number: 5,880,027
[45] Date of Patent: Mar. 9, 1999

[54] PROCESS FOR FABRICATING SEMICONDUCTOR WAFER

[75] Inventors: Hirofumi Hajime; Toshiharu Yubitani, both of Miyazaki, Japan

[73] Assignee: Komatsu Electronic Metals Co., Ltd., Hiratsuka, Japan

[21] Appl. No.: 826,227

[22] Filed: Mar. 27, 1997

[30]     Foreign Application Priority Data

Mar. 29, 1996 [JP] Japan .................................. 8-112914

[51] Int. Cl.$^6$ .................................................. H01L 21/302
[52] U.S. Cl. ........................................... 438/690; 438/692
[58] Field of Search ..................................... 438/690–694

[56]            References Cited

U.S. PATENT DOCUMENTS

| | | | |
|---|---|---|---|
| 3,951,728 | 4/1976 | Egashira et al. | 156/600 |
| 4,276,114 | 6/1981 | Takano et al. | 438/691 |
| 4,885,056 | 12/1989 | Hall et al. | 156/662 |
| 5,679,212 | 10/1997 | Kato et al. | 156/636.1 |

FOREIGN PATENT DOCUMENTS

| | | |
|---|---|---|
| 8-115894 | 5/1996 | Japan . |
| 8-236489 | 9/1996 | Japan . |

OTHER PUBLICATIONS

U.S. Serial No. 08/705,155 by Fumitaka Kai et al. filed Aug. 29, 1996.

Wolf, Stanley "Silicon Processing For The VLSI Era, Volume I: Process Technology", Lattice Press, pp. 5140520, 1986.

*Primary Examiner*—John F. Niebling
*Assistant Examiner*—Michael S. Lebentritt
*Attorney, Agent, or Firm*—Varndell Legal Group

[57]            ABSTRACT

The present invention provides a process for fabricating a semiconductor wafer, including surface-grinding both sides of the sliced wafer, and cleaning the surface-ground wafer with an alkaline solution to remove the sharp protruded part. The frictional resistance between the surface-ground wafer and a polishing cloth can be reduced, thus extending a life of a template and the polishing cloth.

8 Claims, 4 Drawing Sheets

PROCESS FOR FABRICATING SEMICONDUCTOR WAFER

BACKGROUND OF THE INVENTION

1. Field of the Invention

The present invention relates to a process for fabricating a semiconductor wafer by surface-grinding both sides of the sliced wafer and then both-side polishing the wafer.

2. Description of the Prior Art

Conventionally, the semiconductor wafer fabricated by surface-grinding both sides of the sliced wafer and then both-side polishing and mirror processing is fabricated by the following steps (shown in FIG. 3)

(1) A silicon single crystal ingot is sliced by an inner diameter saw to obtain a wafer.
(2) The peripheral portion of the sliced wafer is chamfered to prevent the generation of indentation on the peripheral portion.
(3) The both sides of the chamfered wafer is surface-ground to form uniform thickness.
(4) The surface-ground wafer is washed with water to remove contaminants.
(5) The both sides of the washed wafer are polished simultaneously and mirror processed by a both-side polishing machine. At that time, the wafer to be polished is kept clamped in the template. In order to prevent the wafer from being contaminated by metal, the template is preferably made of resin.
(6) After the mirror processing, the wafer is cleaned to remove the impurities including heavy metal and particles and then dried.

However, according to the above-mentioned conventional process, after surface-grinding, a protruded and indented surface, that is, grinding traces 2, is formed on the grinding side of the wafer 3, as shown in FIG. 4. When the wafer 3 is being both-side polished by the both-side polishing machine, the sharp protruded part 2a of the grinding traces 2 is seized by the receiving surface of the polishing cloth 4. Thus, the frictional resistance of the upper and lower tables 5, 6 when rotation of the upper and lower tables is increased. Consequently, the burden on the contact portion 7a of the template contacting the outer portion of the wafer 3 and the burden of the peripheral gears (not shown) of the template 7 increase, resulting in a shortening of the life of the resin template 7.

Further, when the generated frictional resistance is extremely high, the wafer 3 may release from the template 7 and break.

Still further, the polishing cloth 4 may be damaged by the protruded part 2a, thus accelerating the abrading of the polishing cloth 4 and shortening its life.

SUMMARY OF THE INVENTION

An object of the present invention is to solve the above-mentioned problems and provide a process for fabricating a semiconductor wafer. By the present invention, the frictional resistance between the surface-ground wafer and the polishing cloth can be reduced, and the life of the template and the polishing cloth can be extended.

According to the present invention, the process for fabricating the semiconductor wafer includes slicing an ingot to obtain a wafer; chamfering the peripheral portion of the sliced wafer; surface-grinding the both sides of the chamfered wafer; cleaning the surface-ground wafer by a chemical solution; and polishing the both sides of the washed wafer simultaneously.

DETAILED DESCRIPTION OF THE INVENTION

According to the present invention, the protruded part of a grinding traces on a surface of a wafer, which is generated by the surface-grinding, is cleaned with a chemical solution and removed, thus, the protruded and indented portion on the wafer is smoother. By this, the frictional resistance between the wafer and the polishing cloth can be reduced and the abrasion of the polishing cloth can be minimized.

Figure 1:
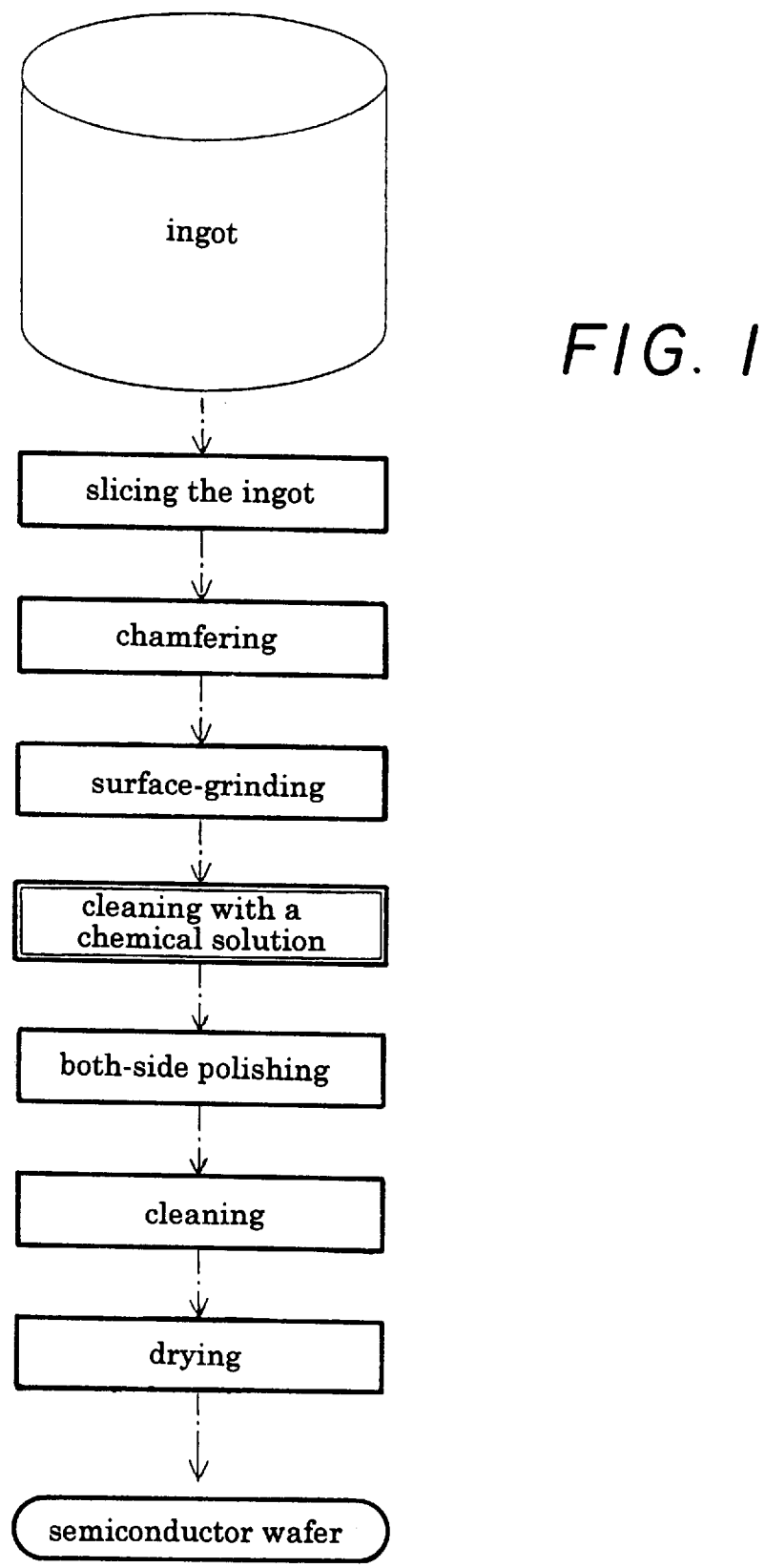
FIG. 1 shows a flow chart of the process for fabricating the semiconductor wafer of the present invention.

Specifically, referring to the flow chart of FIG. 1, the process for fabricating the semiconductor wafer of the present invention includes the following steps of:

(1) slicing an ingot to obtain a wafer;
(2) supporting the sliced wafer by the grinding chuck and surface-grinding both sides of the sliced wafer to form a uniform thickness;
(3) cleaning the surface-ground wafer by a chemical solution; and
(4) polishing the both sides of the washed wafer by a both-side polishing machine simultaneously and mirror processing the wafer; and
(5) cleaning the mirror-processed wafer to remove impurities including heavy metal and particles, and then drying the wafer.

Figure 2A:
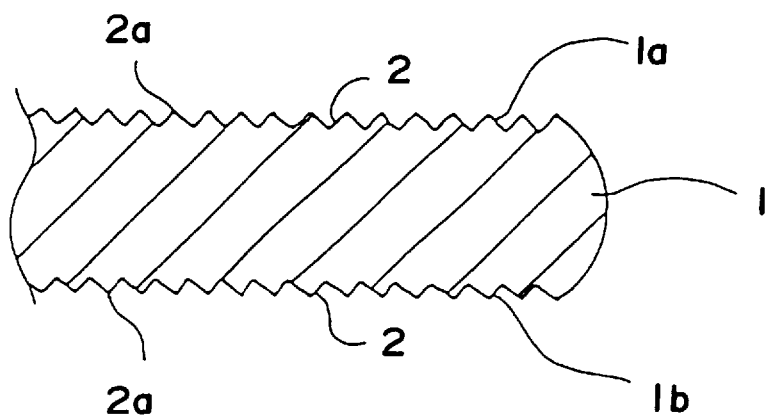
FIGS. 2(a) and 2(b) are a partial enlarged cross-sectional view of the semiconductor wafer showing changes on its surface after cleaning with an chemical solution.

Referring to FIG. 2(a), when the wafer 1 is subjected to surface-grinding, due to the attachment to the grindstone, grinding traces 2 are generated on the sides 1a and 1b of the wafer. The front end of the protruded part 2a of the grinding traces 2 is sharp.

Figure 2B:
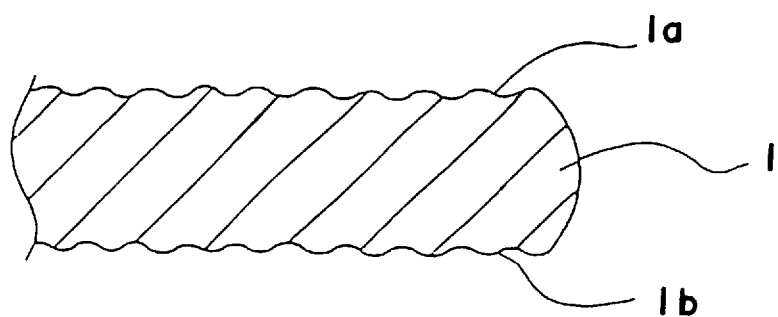
Figure 3:
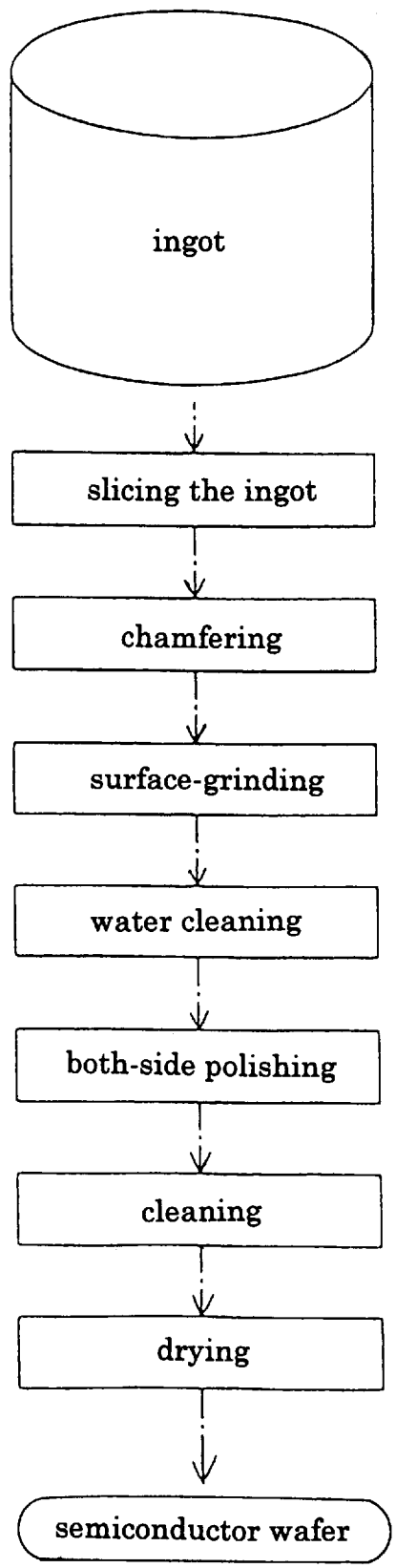
FIG. 3 shows a flow chart of the process for fabricating the semiconductor wafer of the conventional technique.
Figure 4:
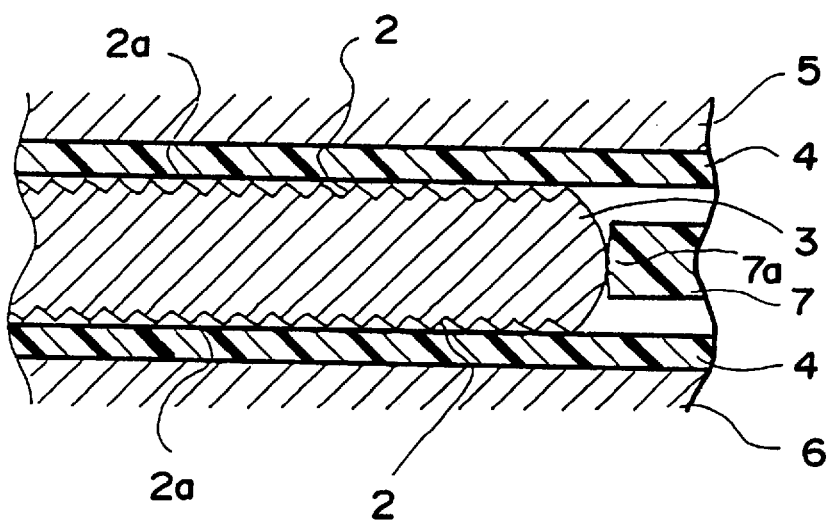
FIG. 4 is a partial enlarged cross-sectional view of the semiconductor wafer fabricated according to the process of the conventional technique when undergoing the both-side polishing.

Referring to FIG. 2(b), the grinding particles attached on the wafer 1 are removed by cleaning with a chemical solution. Thus, the protruded part 2a can be removed, and the protruded and indented portion on the surfaces 1a and 1b can be smoother.

When the wafer 1 is subjected to polishing by a both-side polishing machine, the frictional resistance between the wafer and the polishing cloth can be greatly reduced. Therefore, the burden on the template is decreased and the abrasion of the polishing cloth can be greatly reduced, thus, the polishing cloth and the template can be longer lived.

Furthermore, to polish both sides of the wafer while maintaining the flatness of the surface-ground wafer, the chemical solution used in the present invention is preferably an alkaline solution. The alkaline solution is preferable an aqueous solution of potassium hydroxide, sodium hydroxide, ammonia, or amine.

The embodiments of the present invention below exhibit the change on the surface roughness of the wafer after cleaning with a chemical solution.

For all the embodiments, sodium hydroxide was used as the cleaning solution, and the surface roughnesses of the five arbitrary testing points of each wafer were measured. The results are shown in the tables below, showing the average value of the surface roughness [Ra (unit: nm)]

Embodiment 1

Table 1 shows the surface roughness (Ra) of the wafer of Embodiment 1.

TABLE 1

Surface roughness (Ra) of the wafer of Embodiment 1

| Testing point | 1 | 2 | 3 | 4 | 5 |
|---|---|---|---|---|---|
| After surface-grinding | 8.3 nm | 9.6 nm | 12.7 nm | 12.2 nm | 11.6 nm |
| After chemical solution cleaning | 7.4 nm | 7.6 nm | 8.2 nm | 10.4 nm | 7.9 nm |
| Variation | 0.9 nm | 2.0 nm | 4.5 nm | 1.8 nm | 3.7 nm |

Embodiment 2

Table 2 shows the surface roughness (Ra) of the wafer of Embodiment 2.

TABLE 2

Surface roughness (Ra) of the wafer of Embodiment 2

| Testing point | 1 | 2 | 3 | 4 | 5 |
|---|---|---|---|---|---|
| After surface-grinding | 6.2 nm | 10.3 nm | 9.5 nm | 11.4 nm | 11.4 nm |
| After chemical solution cleaning | 5.3 nm | 7.0 nm | 6.7 nm | 8.1 nm | 7.6 nm |
| Variation | 0.9 nm | 3.3 nm | 2.8 nm | 3.3 nm | 3.8 nm |

As can be seen from the tables, by cleaning with a chemical solution, the surface roughness can be decreased to two-thirds of that obtained by surface-grinding.

Further, after surface-grinding, although the chemical solution for cleaning used in the above embodiments is an alkaline solution, it is not limited to this, a acidic solution such as a mixed acid can also be used and will achieve the same effect.

The object of cleaning with the chemical solution is to remove the protruded part on the surface of the wafer generated by surface-grinding. It is preferable that the thickness variation before and after chemical solution cleaning be within the range of 1 to 50 $\mu$m. Therefore, according to the dissolving speed of the cleaning solution, the cleaning time can be set to achieve the above thickness variation.

By employing the process of the present invention, the both sides of the polished wafer can form smoother protruded and indented portions, thus, the frictional resistance between the wafer and the polishing cloth can be extensively reduced, and the following advantages can be achieved:

(1) Since the burden on the template is decreased, the life of the template can be extended.

(2) Since the burden on the template is decreased, the template can be made of a resin which will not induce metal contamination.

(3) Since the abrasion of the polishing cloth is extensively decreased, the life of the polishing cloth can be extended.

What is claimed is:

1. A process for fabricating a semiconductor wafer, comprising the following steps of:
    (1) slicing an ingot to obtain a wafer;
    (2) chamfering peripheral portions of the wafer;
    (3) surf ace-grinding both sides of the wafer;
    (4) cleaning the both sides of the wafer with a chemical solution for only removing a protruded portion of the surface-ground wafer; and
    (5) polishing the both sides of the wafer simultaneously.

2. The process as claimed in claim 1, wherein the chemical solution is an alkaline solution.

3. The process as claimed in claim 1, wherein the chemical solution is an acidic solution.

4. The process as claimed in claim 2, wherein the alkaline solution is an aqueous solution selected from the group consisting of potassium hydroxide, sodium hydroxide, ammonia and amine.

5. The process as claimed in claim 3, wherein the acidic solution is a mixed acid.

6. The process as claimed in claim 1, wherein the cleaning step comprises a step of cleaning the both sides of the wafer with the chemical solution so that the protruded portion on the ground wafer is removed while maintaining the flatness of the surface-ground wafer.

7. The process as claimed in claim 1, wherein the cleaning step comprises a step of cleaning the both sides of the wafer with a chemical solution for reducing surface roughness of the wafer.

8. The process as claimed in claim 1, wherein the cleaning step comprises a step of cleaning the both sides of the wafer with a chemical solution for extending life of a polishing cloth; and the polishing step comprises a step of polishing the both sides of the wafer simultaneously with the polishing cloth.

* * * * *